United States Patent [19]
Hardt et al.

[11] Patent Number: 6,052,281
[45] Date of Patent: Apr. 18, 2000

[54] COMPUTER CHASSIS WITH AIRFLOW CONTROL MECHANISMS

[75] Inventors: Thomas T. Hardt, Missouri City; Joseph R. Allen, Tomball; B. Tod Cox; Bonnie E. Prichep, both of Houston; Karl J. Dobler, Cypress, all of Tex.

[73] Assignee: Compaq Computer Corporation, Houston, Tex.

[21] Appl. No.: 09/249,031

[22] Filed: Feb. 12, 1999

[51] Int. Cl.$^7$ ...................................................... H05K 7/20
[52] U.S. Cl. ........................ 361/690; 361/683; 361/684; 361/687; 361/692; 361/695; 361/728; 359/163; 359/152; 455/90
[58] Field of Search ...................................... 361/684, 683, 361/685–689, 690–697, 724–728, 734, 736, 740, 741, 754, 796, 798–801, 818, 829; 359/163, 152; 211/41.1, 26; 312/332.1, 333; 165/80.2, 80.3

[56] References Cited

U.S. PATENT DOCUMENTS 5,767,999  6/1998  Hardt et al. .............................. 359/163

*Primary Examiner*—Leo P. Picard
*Assistant Examiner*—Michael Datskovsky
*Attorney, Agent, or Firm*—Jenkens & Gilchrist, a Professional Corporation

[57] ABSTRACT

An electronic component chassis with a first side, a second side, and having a preferred airflow therebetween. The first side of the electronic component chassis includes an insertion slot for receiving a removable component that is to be inserted into the electronic component chassis. The insertion slot is automatically closed by an airflow control door when the removable component is not housed by the electronic component chassis. By closing the insertion slot, the preferred airflow between the first side and the second side is enabled.

18 Claims, 6 Drawing Sheets

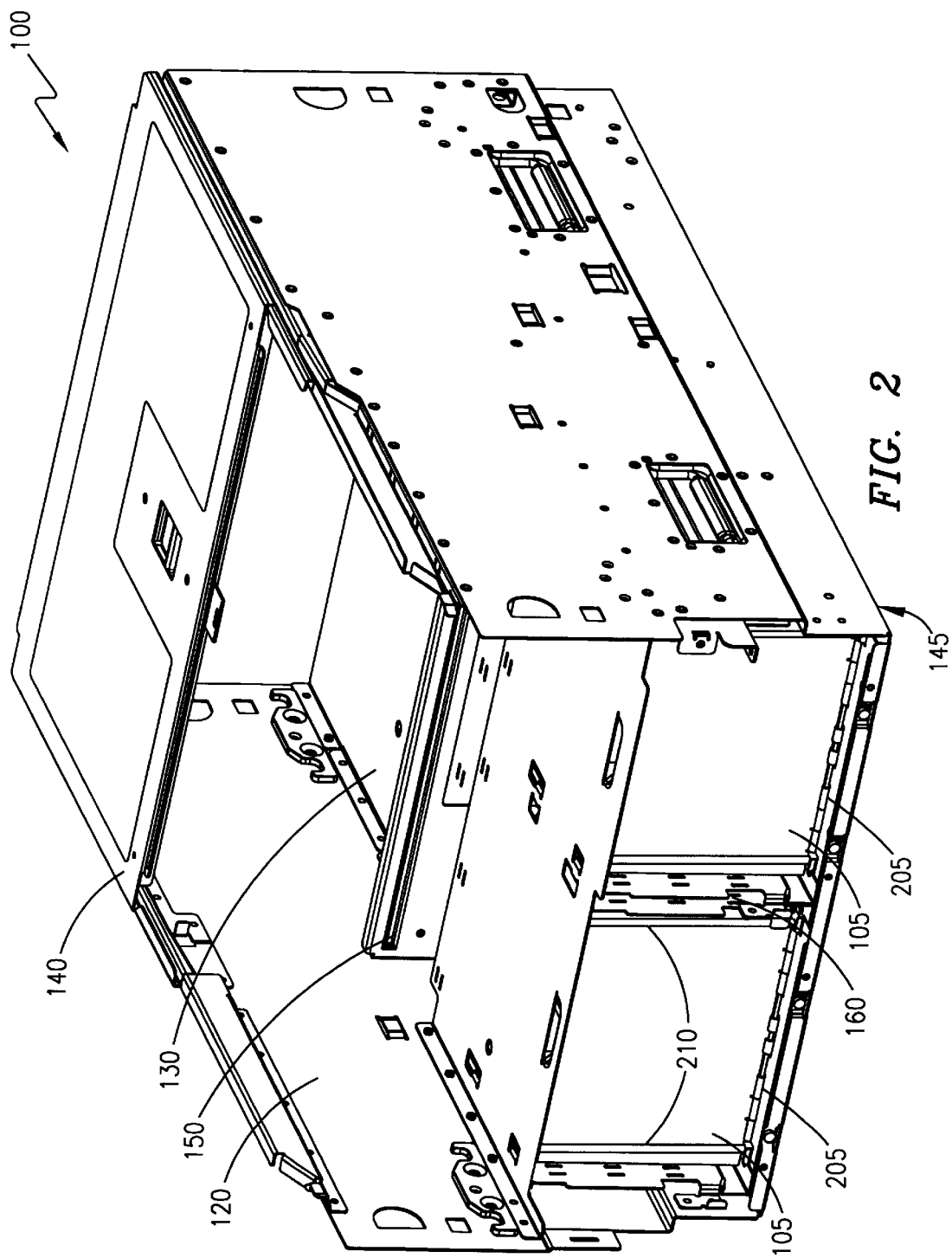

COMPUTER CHASSIS WITH AIRFLOW CONTROL MECHANISMS

CROSS-REFERENCE TO RELATED APPLICATIONS

This Application relates to the application entitled: COMPUTER CHASSIS WITH INTEGRATED COOLING FEATURES, Kurt Manweiler, Tom Hardt, Joseph Allen and Wade Vinson inventors, (Attorney Docket Number, 27757/00207, U.S. application Ser. No. 09/249,039, filed Feb. 12, 1999 which is incorporated in its entirety herein by reference.

BACKGROUND OF THE INVENTION

1. Field of the Invention

This invention relates generally to a computer chassis for free standing or rack mounting use, and more particularly, but not by way of limitation, to a computer chassis with airflow control mechanisms that enable cooling of electronic components housed inside the computer chassis.

2. Description of Related Art

Networks serve the purpose of connecting many different personal computers (PCs), workstations, or terminals to each other, and to one or more host computers, printers, file servers etc., so that expensive computing assets, programs, files and other data may be shared among many users.

In a network utilizing a client/server architecture, the client (personal computer or workstation) is the requesting machine and the server is the supplying machine, both of which may preferably be connected via the network, such as a local area network (LAN), wide area network (WAN) or metropolitan area network (MAN). This is in contrast to early network systems that utilized a mainframe with dedicated terminals.

In a client/server network, the client typically contains a user interface and may perform some or all of the application processing and, as mentioned above, can include personal computers or workstations. The server in a client/server network can be a high-speed microcomputer or minicomputer and in the case of a high-end server can include multiple processors and mass data storage such as multiple CD-ROM drives and multiple hard drives, preferably with redundant array of inexpensive disk (RAID) protection. An exemplary server such as a database server maintains the databases and processes requests from the client to extract data from or update the database. An application server provides additional business processing for the clients. The network operating system (NOS) together with the database management system (DBMS) and transaction monitor (TP monitor) are responsible for the integrity and security of the server.

Client/server networks are widely used throughout many different industries and business organizations, especially where mission-critical applications requiring high performance are routinely launched. The mass storage and multi-processing capabilities provided by current client/server network systems (for example, the high-end servers) that run such applications permit a wide range of essential services and functions to be provided through their use.

As can be appreciated, many businesses are highly dependent upon the availability of their client/server network systems to permit essential network services and functions to be carried out. As client/server network systems become increasingly essential to the everyday operations of such businesses, additional steps need to been taken in the design and construction of the server in the client/server network system to ensure its continuous availability to the clients. That is to say, in the design and construction of a server, steps need to be taken to ensure that the server can be operated with little or no downtime.

It can be appreciated by those skilled in the art that high availability, reliability and serviceability are valuable design aspects in ensuring that a server is a "zero downtime" system that will operate with little or no downtime. The modularity of components within a server has been recognized as an important design consideration in ensuring that the downtime of a server will be minimized. Modules can be removed and examined for operability or other purposes much easier than permanently mounted fixtures within a server chassis. When various components of a server can be provided in a modular form, they can also be readily replaced to maintain the operational status of the server with minimal downtime.

Removable modular components may include disc drives and power supplies. As described above, the removability of modular components allows for better overall serviceability of the computer system which is a distinct advantage. For example, a defective power supply in the server generally requires prompt replacement in order to limit downtime. Modular components and connectors facilitate prompt replacement and are thus popular in many computer designs.

Originally, a rule of practice in the maintenance of modular components or printed circuit boards of a server was that of turning the power to the server off before any modular components or printed circuit boards were removed from or added to the chassis or support frame of the server. Recent innovations have centered around a highly desirable design goal of "hot-pluggability" which addresses the benefits derived from inserting and removing modular components and printed cards from the chassis of the server when the server is electrically connected and operational. It can be readily appreciated that modularization and hot-pluggability can have a significant bearing on the high availability aspect of a high-end server.

Hot-pluggable components may include storage or disc drives, drive cages, fans, power supplies, system I/O boards, control boards, processor boards, and other sub-assemblies. The ability to remove these constituent components without having to power down the server allows for better overall serviceability of the system, which is a distinct advantage to both the user and the maintenance technician.

Component redundancy has also been recognized as an important design consideration in ensuring that a server will operate with little or no downtime. Essentially, component redundancy is typically provided in a system to better ensure that at least one of the redundant components is operable, thereby minimizing the system down time. With component redundancy, at least two components are provided that can perform the same function, such that if one of the components becomes faulty for some reason, the operation fails over to the redundant component. When at least one of the redundant components is operable, continued operation of the computer system is possible even if others of the redundant components fail. To further enhance reliability and serviceability, redundant components have been made hot pluggable.

Dynamic reconfiguration of a server system can also be accomplished by providing upgradable modular components therein. As can be readily appreciated, this objective can be accomplished by the addition or substitution of components having different circuits, preferably updated or upgraded, disposed there within. When components are redundant and hot pluggable, reconfiguration of the server is often possible without taking the server offline.

Another important design aspect with respect to providing redundant and hot pluggable components in a server system is to ensure and maintain a safe working environment while the server is operating and being repaired or upgraded. Accordingly, when the system components are swapped or upgraded, the exposure of hot connectors and contacts must be kept to a minimum. It can be appreciated by those skilled in the art that further developments in this area would significantly enhance the reliability and serviceability aspects of a high-end server system.

To further enhance the serviceability of server systems, additional innovations may be required in the design and construction of diagnostic sub-systems thereof. In existing client/server network systems it is often difficult to obtain, in a timely manner, important diagnostic data and information corresponding to a component failure in order to facilitate the quick serviceability of the server. Therefore, it can be appreciated that the more information that can be readily provided to locate a defective component or problem with the server, the better the optimization of the amount of time the server is up and running.

Although the cooling of computer systems has always been a concern with computer designers, the form factor of the chassis, hot pluggable components, and the high demands for improved reliability of the client/server network systems (with ever-increasing microprocessor power dissipation and system power consumption) have created additional problems with cooling system design, especially in temperature monitoring and temperature control. Not only are the high end servers utilizing the newer high powered processors, but they are also utilizing multiple processors, thereby creating even more heat within the system.

Most often, microprocessors and associated electrical components are cooled by airflow. Fans are used to push or pull air from one side of a chassis holding the electrical components, across the electrical components and out the other side of the chassis. By forcing air to flow over the electrical components, heat is dissipated, thereby preventing the electrical components from overheating and failing.

The ability to cool electrical components with air is restricted by the ability to channel or direct the airflow through the chassis and across the electrical components. Airflow follows the path of least resistance, and in many cases, the path of least resistance does not cross the electrical components that need to be cooled. Accordingly, large volumes of air may be pulled through a chassis without ever cooling any of the electrical components contained inside. Frequently, the end result of this scenario is that the components overheat and the electrical components inside the chassis fail.

Existing systems avoid pulling air through a chassis without cooling the included electrical components by directing or channeling airflow through the chassis. To direct the airflow through the chassis, existing systems include airflow barriers placed throughout the chassis. These airflow barriers, however, are generally designed around certain configurations of electrical components within the chassis, i.e., certain electrical components serve as airflow barriers. These electrical component configurations are often altered when particular components are removed—such as for servicing. In systems that require that the power to the computer be turned off before the electrical components can be removed from the computer chassis, the alteration of the electrical component configuration is not necessarily a problem because the electrical components are not generating new heat while powered down. Thus, by virtue of being powered down, the electrical components in the chassis will not overheat if airflow barriers are removed.

With the introduction of modular components and hot pluggable components, particular components may be added or removed while the other components in the chassis remain powered-up. In effect, components can be removed from the chassis while the other components continue to generate heat. If the removed component was integral to directing airflow through the chassis, airflow within the chassis could easily be disrupted so that certain electrical components overheat, thereby causing those components to fail.

Because failure of any electrical component could disrupt the operation of the entire computer system, it is desirable to have a computer chassis that produces high efficiency cooling, minimizes system down time, and adapts for different electrical component configurations.

SUMMARY OF THE INVENTION

The present invention overcomes the above identified problems as well as other shortcomings and deficiencies of existing technologies by providing a computer chassis for housing removable components. The computer chassis includes a first side and a second side and a preferred airflow therebetween. For example, the first side can be a back sidewall and the second side can be a front sidewall of the computer chassis, and the preferred airflow can be a preferred airflow path between the front sidewall and the back sidewall, or vice versa. The computer chassis further includes at least one insertion slot in the first side. The insertion slot is configured to receive one of the removable components. For example, the insertion slot is configured to receive a "hot-pluggable" power supply. The computer chassis further includes an airflow control door that controls airflow through the insertion slot. The airflow control door is movable between a first position and a second position, e.g., open position and closed position. When the airflow control door is in the first position, it enables the preferred airflow from the first side of the computer chassis to the second side of the computer chassis by closing the insertion slot. When the airflow control door is in the second position, it enables the removable component to be inserted into the computer chassis.

It is contemplated that the airflow control door can be configured to be engaged by the removable component thereby causing the airflow control door to move from one position to another. It is further contemplated that the airflow control door can include a guide system for guiding the removable component through the insertion slot and into the computer chassis.

The computer chassis can also be configured to include a support mechanism for supporting the removable component once it is inserted into the computer chassis. The support mechanism can support the removable component so that the removable component, once inside the computer chassis, is at a particular angle relative to the computer chassis. For example, the support mechanism may elevate a portion of the removable component so that the entire component is parallel with the top or bottom of the computer chassis. The support mechanism can also compensate for any elevation support from the airflow control door or the guide system.

In another embodiment, the present invention provides a closure device for closing a removable component insertion slot in a computer chassis. The closure device includes a movable panel configured to be connected to the computer chassis. The panel is movable between a first position and a second position. For example, the panel would be open when the removable component is inserted into the computer chassis through the insertion slot and the panel would be closed when the removable component is removed from the insertion slot. The closure device further includes a tension system for biasing the panel towards one position, e.g., the closed position. The tension system could be a spring-loaded hinge or any other biasing mechanism. It is contemplated that a guide system can be attached to the panel such that the removable component can be guided through the insertion slot and into the chassis. The guide system could be one or more raised "rails" or one or more grooves.

BRIEF DESCRIPTION OF THE DRAWINGS

A more complete understanding of the present invention may be had by reference to the following Detailed Description and appended claims when taken in conjunction with the accompanying Drawings wherein:

FIG. 2 is a rear perspective of a computer chassis with the airflow control doors in a closed position;

DETAILED DESCRIPTION

Figure 1:
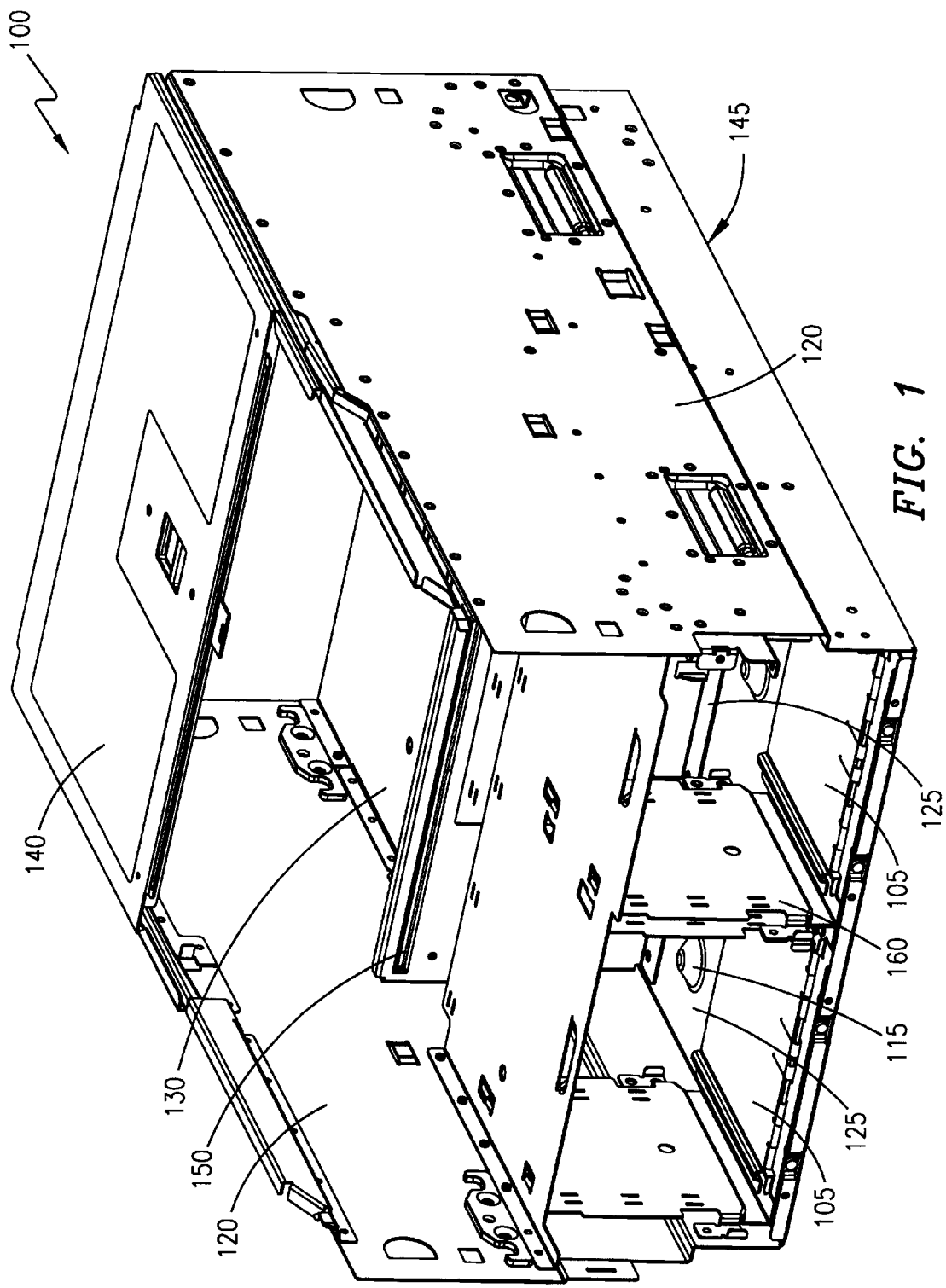
FIG. 1 is a rear perspective of a computer chassis constructed in accordance with the principles of the present invention.

In the drawings, like or similar elements are designated with identical reference numerals throughout the several views and the various elements depicted are not necessarily drawn to scale.

Figure 1A:
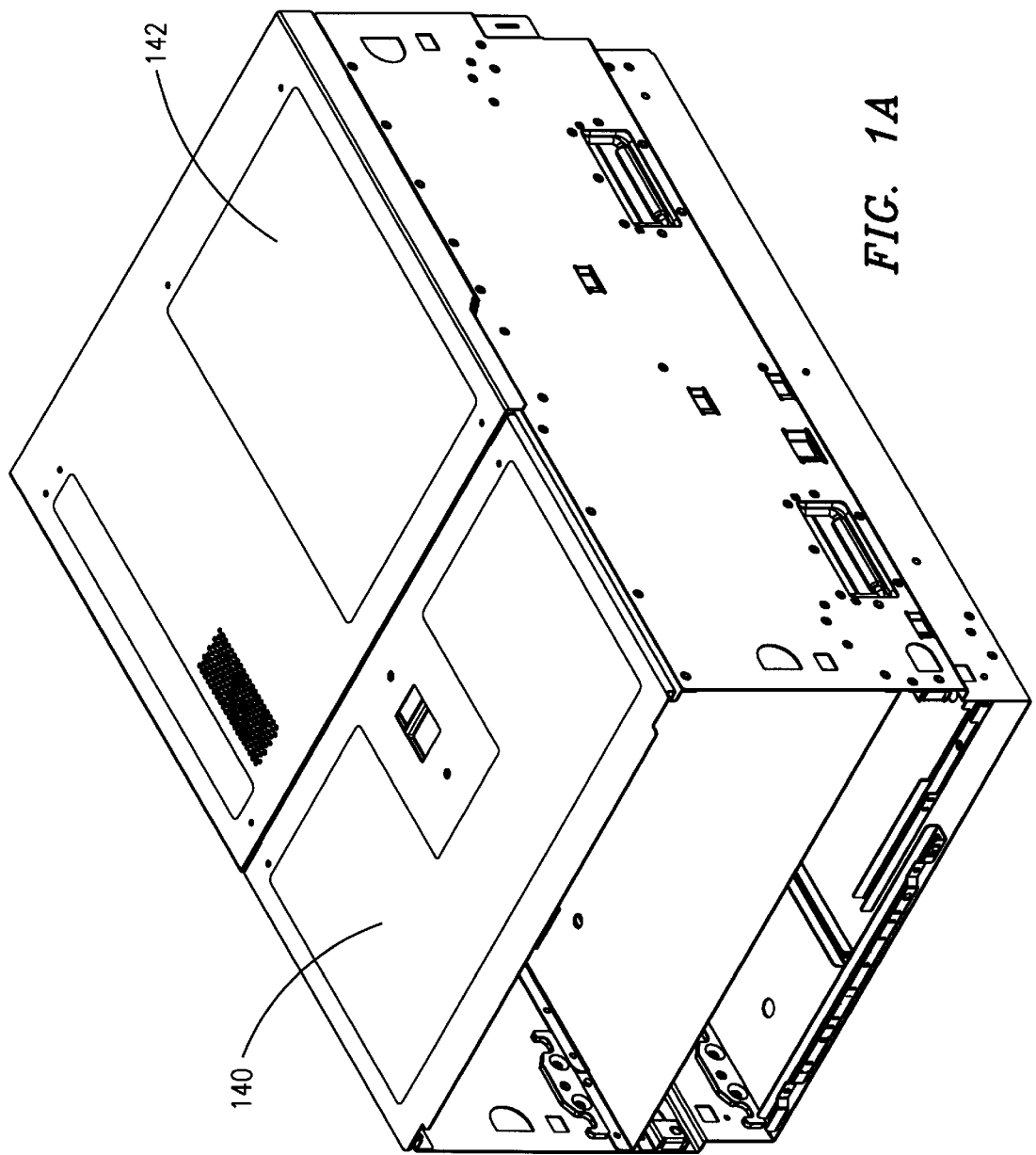
FIG. 1a illustrates the computer chassis of FIG. 1 with a closed top panel.

Now referring to FIGS. 1 and 1a, there is illustrated a rear perspective of a computer chassis 100 constructed in accordance with the principles of the present invention. The computer chassis 100 includes sidewalls 120, top plate 140 and bottom plate 145, which together make up the shell of the computer chassis 100. The top plate 140 can include a slidable portion 142 as is depicted in FIG. 1a. The slidable portion 142 is movable between the closed position illustrated in FIG. 1a and the open position illustrated in FIG. 1—either through removing the slidable portion 142 or through sliding it back. The open position illustrated in FIG. 1 allows for user access to electrical components housed within the computer chassis 100.

Although the computer chassis 100 is shown to be generally a rectangular box, it is not limited in this regard. For example, the computer chassis 100 is shown to be rack-mountable with a height measurement of 12.25 inches (a 7U form factor). The computer chassis 100, however, need not be any particular form factor or even rack-mountable. It is further contemplated that sidewalls 120 and bottom plate 145 can be constructed from a single panel.

The computer chassis 100 also includes a tier support 130 and a vertical divider 160 that can also serve to brace the tier support 130. The tier support 130 allows for two tiers of electrical components to be housed inside the computer chassis 100. Although only one tier support 130 is shown, it is contemplated that any number of tier supports could be employed to allow the computer chassis 100 to house multiple tiers of electrical components. It is also contemplated that the computer chassis 100 could include no tier support 130.

Still referring to FIG. 1, the computer chassis 100 further comprises two removable-component insertion slots 125 located on the back of the computer chassis 100. It is contemplated that any number of removable-component insertion slots 125 can be incorporated into the computer chassis 100. It is further contemplated that the removable-component insertion slots 125 can be located on any tier or any side of the computer chassis 100. The removable-component insertion slots 125 are configured to be closed by the airflow control doors 105. These airflow control doors 105 are connectable by a hinged connection to the bottom plate 145 of the computer chassis 100. In various embodiments, however, the airflow control doors 105 could be attached numerous places on the computer chassis 100 other than on the bottom plate 145. For example, the airflow control doors 105 could be attached to one of the sidewalls 120 or the tier support 130. Further, the airflow control doors 105 can be connected to the computer chassis 100 by a variety of mechanisms including but not limited to spring-loaded hinges.

The airflow control doors 105 in FIG. 1 are illustrated to be in the open position even though no removable component is inserted into the computer chassis 100. Because the airflow control doors 105 are biased towards the closed position in the preferred embodiment, the airflow control doors 105 are generally in the open position only when a removable component is inserted into the removable-component insertion slot 125.

Also illustrated in FIG. 1 is a support mechanism 115. The support mechanism 115 is for supporting the removable component once inserted into one of the removable-component insertion slots 125. The support mechanism 115 supports the removable component so that it is at a particular angle relative to the computer chassis 100. Generally, that particular angle is parallel with the bottom plate 145 of the computer chassis 100. By supporting the removable component at the proper angle, the support mechanism 115 helps assure that any connections on the removable component line up with the proper connections inside the computer chassis 100, such as those on the mid-plane board 150. The support mechanism 115 is illustrated to be a single raised, circular support. It is contemplated that the support, however, could be multiple supports of any shape or size—including one or more rails for supporting the removable component along its length.

Referring now to FIG. 2, there is illustrated a rear perspective of the computer chassis 100 with the airflow control doors 105 in a closed position. The computer chassis 100 is shown to include the sidewalls 120, the top plate 140, the bottom plate 145, and the tier support 130. As illustrated, the airflow control doors 105 are connected to the bottom plate 145 by a hinge mechanism 205. Each airflow control door 105 is attached to a separate hinge mechanism 205 thereby allowing each airflow control door 105 to operate independently. Additionally, the hinge mechanism 205 is configured to bias the airflow control doors 105 towards the closed position. It is contemplated that the hinge mechanism 205 can be spring loaded to provide the necessary bias for closing the airflow control doors 105. The necessary bias, however, can be provided in any number of other fashions.

When in the closed position, the airflow control doors 105 substantially close the removable-component insertion slots 125 (illustrated in FIG. 1). In the closed position, the top portion of the airflow control doors 105 engages or nearly engages the tier support 130. If the computer chassis 100 did not include such a tier support 130, then the airflow control doors 105 would engage or nearly engage the top plate 140 of the computer chassis 100. In the embodiment illustrated in FIG. 2, the airflow control doors 105 also engage the vertical divider 160. Although the airflow control doors 105 are illustrated as attached to the bottom plate 145 and engaging the tier support 130, the airflow control door could be mounted on any computer chassis 100 surface and could engage any other surface. The airflow control doors 105 need only substantially close a removable-component insertion slot 125. For example, the airflow control door could be mounted to the tier support 130 and engage the bottom plate 145.

The airflow control doors 105 in FIG. 2 illustrate guide rails 210. These guide rails 210 are configured to engage the removable component and guide it through the removable-component insertion slot 125 and into the computer chassis 100. In this embodiment, two guide rails are illustrated. Multiple guide rails, guide grooves, or any other type of guiding system, however, may be employed in the present invention to properly guide the removable component.

Figure 3:
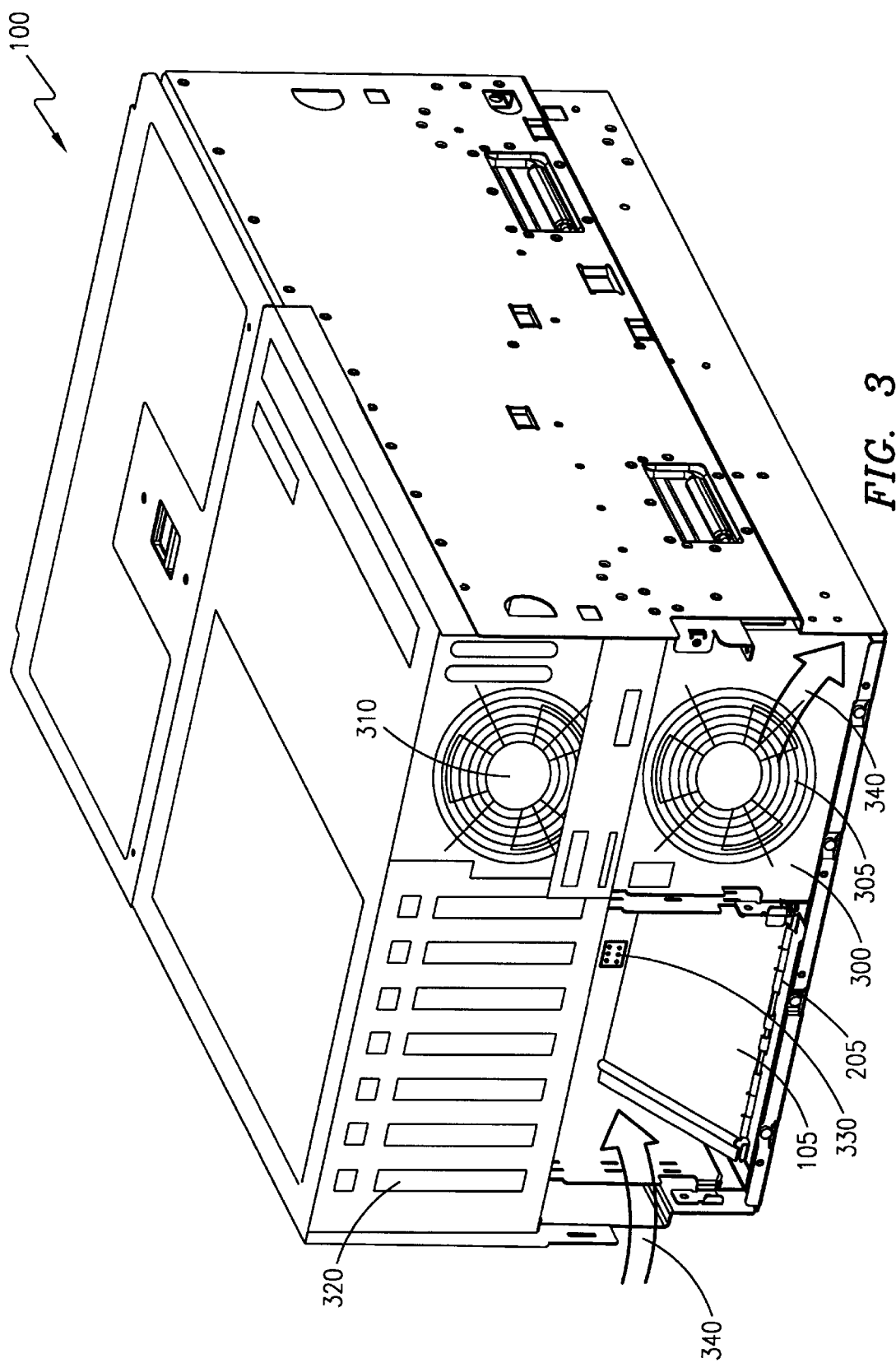
FIG. 3 is a rear perspective of a computer chassis with a removable component inserted into one of the two insertion slots.

Referring now to FIG. 3, there is illustrated a rear perspective of a computer chassis 100 with a removable power supply 300 inserted into one of the two removable-component insertion slots 125. The removable power supply 300 can include an incorporated fan for cooling both the removable power supply 300 and any electrical components housed by the computer chassis 100. FIG. 3 shows the computer chassis 100 with removable input/output (I/O) covers 320, a "hot-pluggable" fan 310 and a removable component connector 330. The removable power supply 300 is shown as fully inserted into the computer chassis 100 through one of the two removable-component insertion slots 125. The airflow control door 105 associated with that particular removable-component insertion slot 125 is in a horizontal position beneath the removable power supply 300. The other airflow control door 105 is illustrated to be half open as if a removable component was just removed.

The removable component connector 330 illustrated in FIG. 3 is for connecting a removable component, such as the removable power supply 300, to other electrical components housed in the computer chassis 100. The removable component connector 330 may be attached to a mid-plane board 150, a back-plane board (not shown), directly to another electrical component, etc. In one embodiment, the removable component connector is configured to couple with the connections (not shown) of the removable power supply 300. The guide rails 210 help guide the connections of the removable components (such as the removable power supply 300) into the electrical connector 330 thereby protecting the connections from being bent or otherwise damaged.

The removable connector 330 and the electrical components coupled thereto are further protected by the airflow control door 105. In addition to enabling a preferred airflow through the computer chassis 100, the airflow control doors 105 can provide electromagnetic shielding and prevent unwanted, harmful objects from being easily inserted into the computer chassis 100 through an open removable-component insertion slot 125.

Also illustrated in FIG. 3 is an airflow pattern 340. Generally, a fan pulls air from the front of the computer chassis 100 across the housed electrical components. Preferably, the fan associated with the removable power supply 300 pulls air from the front of the computer chassis 100 across the housed electrical components and exhausts the air through the back of the removable power supply 300. When a removable-component insertion slot 125 is not closed, however, the fan pulls air not from the front of the computer chassis 100, but rather from the open removable-component insertion slot 125. This airflow pattern is illustrated as airflow pattern 340. Airflow will follow the path of least resistance and the short path from the open removable-component insertion slot 125 to the removable power supply 300 is a path with substantially less resistance than the path from the front of the computer chassis 100 to the back of the computer chassis 100. Because airflow 340 does not flow over many of the electrical components housed inside the computer chassis 100, those electrical components can quickly overheat and cause system failure. As can be readily appreciated, when the open removable-component insertion slot 125 is closed, however, air cannot be pulled through it. Thus, the airflow must follow a different path, preferably from the front of the computer chassis 100 to the back. Thus, when the removable-component insertion slot 125 is closed, the preferred airflow is enabled and the electrical components can be cooled in the designed fashion.

Figure 4:
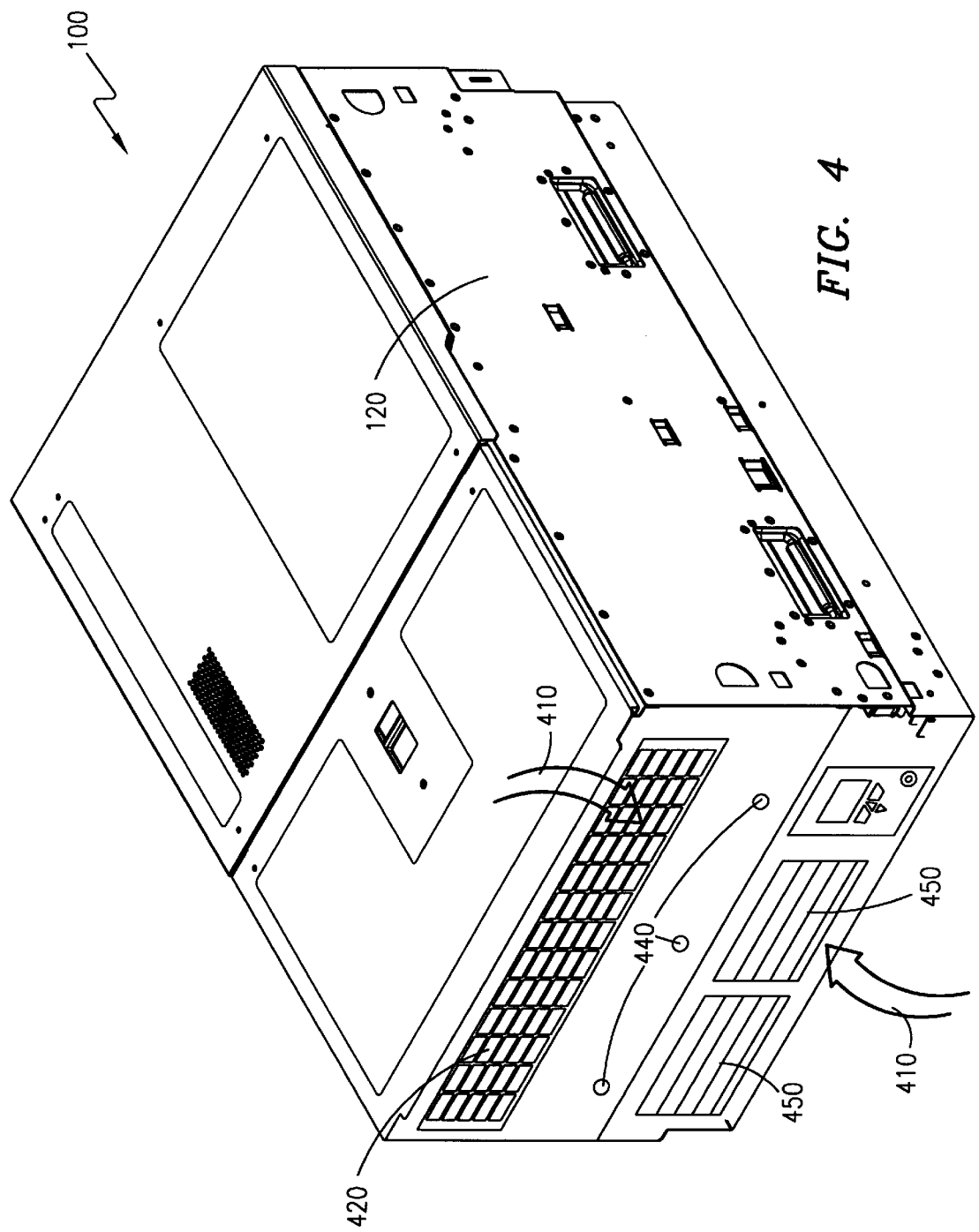
FIG. 4 is a frontal perspective of a computer chassis with air intakes.

Referring now to FIG. 4, there is illustrated a frontal perspective of the computer chassis 100 with disk drives 450 and air intakes 420 and 440. The disk drives 450 are for illustrative purposes only and can be any computer device including tape drives, performance monitors, electrical connectors, optical drives, etc. FIG. 4 further illustrates a preferred airflow 410 through the computer chassis 100. Fans pull air (although in certain embodiments, fans may push air through the chassis) from the front of the computer chassis 100 through at least one of the air intakes 420 and 440 and across the electrical components inside the computer chassis 100. Depending upon duct work and electrical component placement inside the computer chassis 100, the fan may only pull air through one of the air intakes 420 and 440. For example, the airflow through air intake 420 may be isolated from the airflow through air intake by the tier support 130 or any other divider. Thus, multiple preferred airflows may exist in the same computer chassis 100. To achieve the preferred airflow illustrated as airflow 410, however, the removable-component insertion slots 125 must be closed either by the airflow control doors 105 or by the insertion of a removable component.

Although only air intakes 420 and 440 are illustrated, it is contemplated that multiple other air intakes could be provided. Air intakes, for example, can be included on any side of the computer chassis 100 or incorporated with the disk drives 450. It is contemplated that air intakes of various sizes can be placed at any location on the computer chassis 100.

Figure 5:
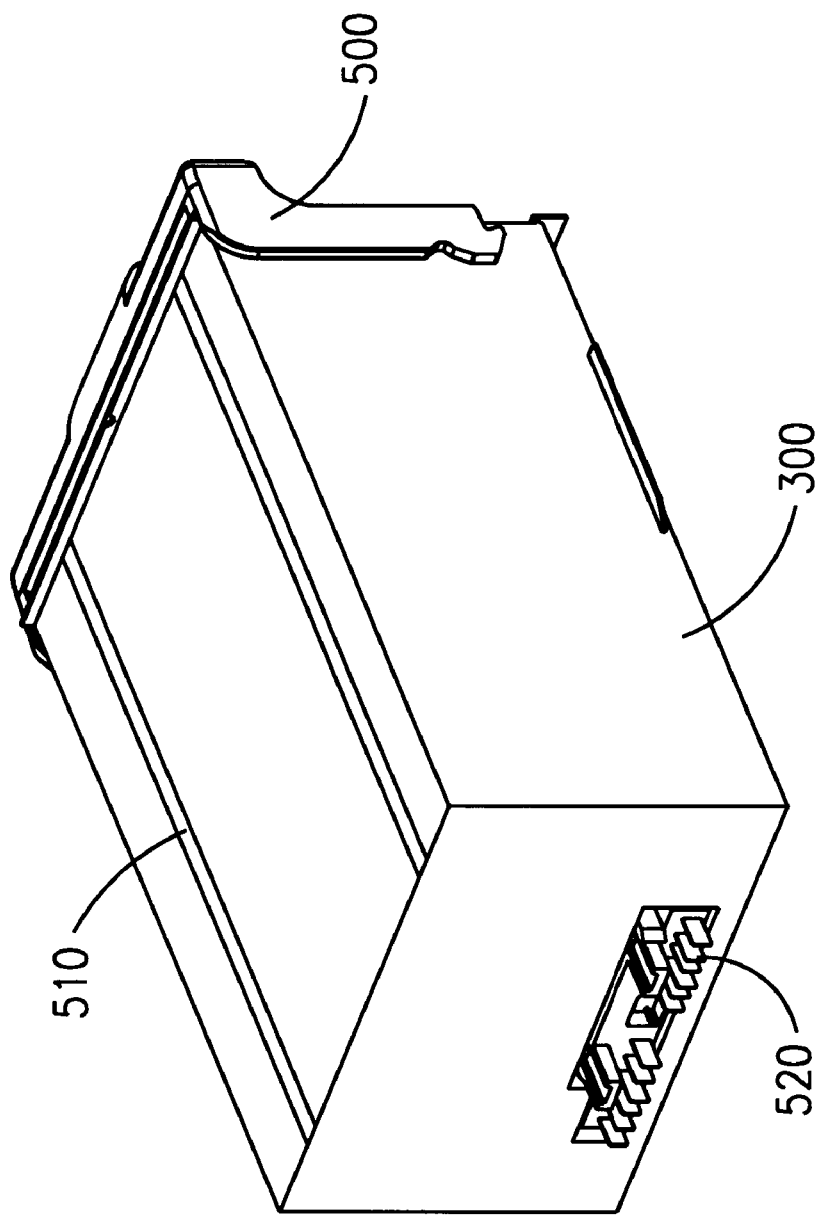
FIG. 5 is a removable power supply configured to be insertable into the computer chassis.

Referring now to FIG. 5, there is illustrated a rear perspective view of the removable power supply 300, which may be "hot-pluggable", configured to be insertable into the computer chassis 100 via the removable-component insertion slots 125. The removable power supply 300 is shown to have an incorporated handle 500, guide grooves 510 and an electrical connector 520. The guide grooves 510 are configured to receive the guide rails 210 (illustrated in FIG. 2) and guide the removable power supply 300 into the computer chassis 100. By guiding the removable power supply 300 into the computer chassis 100, the electrical connectors 520 can securely engage the removable component connector 330 inside the computer chassis 100 and avoid damaging the pins or any connectors. It is contemplated that the general design of the removable power supply 300 can be used for any removable component that will be inserted into the computer chassis 100 through the removable-component insertion slots 125.

Therefore, as can be appreciated by one ordinarily skilled in the art, the above described invention provides a computer chassis with efficient, effective cooling features. The computer chassis is designed to include a first side, a second side and a preferred airflow therebetween. The preferred airflow is enabled either when a removable component is inserted into an insertion slot in the second side of the computer chassis or when a airflow control door closes the insertion slot left open when the removable component is not inserted into the computer chassis.

Although a preferred embodiment of the apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. An improved computer chassis having a component bay for housing a removable component therein, the improved computer chassis having a first internal volume defined by a first external peripheral border, the component bay having a second internal volume within the first internal volume defined by a second external peripheral border, the component bay being externally accessible through a first portion of the first external peripheral border and a first portion of the second external peripheral border, the improvement comprising:

an airflow control door movably connected to the chassis proximate to the first portion of the second external peripheral border, the airflow control door being movable between a first position and a second position;

wherein the airflow control door, when in the first position, prevents external access to the component bay through the first portion of the second external peripheral border and thereby prevents airflow to and from the component bay through the first portion of the second external peripheral border;

wherein the airflow control door, when in the second position, allows external access to the component bay through the first portion of the second external peripheral border and thereby allows the removable component to be received in the component bay through the first portion of the second external peripheral border; and wherein the airflow control door has guide means for guiding the removable component into the component bay.

2. The improved computer chassis as defined in claim 1, wherein the guide means includes guide rails formed in the airflow control door.

3. The improved computer chassis as defined in claim 1, wherein the guide means includes guide rails attached to the airflow control door.

4. The improved computer chassis as defined in claim 1, wherein the first portion of the first external peripheral border coincides with the first portion of the second external peripheral border;

wherein the airflow control door, when in the first position, also prevents external access to the component bay through the first portion of the first external peripheral border and thereby prevents airflow to and from the component bay through the first portion of the first external peripheral border;

wherein the airflow control door, when in the second position, also allows external access to the component bay through the first portion of the first external peripheral border and thereby allows the removable component to be received in the component bay through the first portion of the first external peripheral border.

5. The improved computer chassis as defined in claim 1, wherein the airflow control door is hingedly connected to the chassis proximate to the first portion of the second external peripheral border.

6. The improved computer chassis as defined in claim 1, further comprising:

biasing means associated with the airflow control door for biasing the airflow control door toward the first position.

7. The improved computer chassis as defined in claim 1, further comprising:

support means disposed proximate the component bay for supporting the removable component in the component bay.

8. The improved computer chassis as defined in claim 1, wherein the airflow control door, when in the first position, provides electromagnetic shielding to the component bay and the chassis.

9. An improved computer chassis having a component bay for housing a removable component therein, the improved computer chassis having a first internal volume defined by a first external peripheral border, the component bay having a second internal volume within the first internal volume defined by a second external peripheral border, the component bay being externally accessible through a first portion of the first external peripheral border and a first portion of the second external peripheral border, the improvement comprising:

an airflow control door movably connected to the chassis proximate to the first portion of the second external peripheral border, the airflow control door being movable between a first position wherein external access to the component bay is obstructed by the airflow control door and a second position wherein external access to the component bay is unobstructed by the airflow control door, the airflow control door having guide means for guiding the removable component into the component bay.

10. The improved computer chassis as defined in claim 9, wherein the guide means includes guide rails formed in the airflow control door.

11. The improved computer chassis as defined in claim 9, wherein the guide means includes guide rails attached to the airflow control door.

12. The improved computer chassis as defined in claim 9, wherein the first portion of the first external peripheral border coincides with the first portion of the second external peripheral border;

wherein the airflow control door, when in the first position, also obstructs external access to the component bay through the first portion of the first external peripheral border and thereby prevents airflow to and from the component bay through the first portion of the first external peripheral border;

wherein the airflow control door, when in the second position, also allows unobstructed external access to the component bay through the first portion of the first external peripheral border and thereby allows the removable component to be received in the component bay through the first portion of the first external peripheral border.

13. The improved computer chassis as defined in claim 9, wherein the airflow control door is hingedly connected to the chassis proximate to the first portion of the second external peripheral border.

14. The improved computer chassis as defined in claim 9, further comprising:

biasing means associated with the airflow control door for biasing the airflow control door toward the first position.

15. The improved computer chassis as defined in claim 9, further comprising:

support means disposed proximate the component bay for supporting the removable component in the component bay.

16. The improved computer chassis as defined in claim 9, wherein the airflow control door, when in the first position, provides electromagnetic shielding to the component bay and the chassis.

17. A system for providing improved airflow in a chassis capable of receiving a removable component, the system comprising:

a chassis having an internal volume defined by an external peripheral support structure, the external peripheral support structure having an opening for receiving the removable component in the chassis;

an airflow control panel movably connected to chassis proximate the opening, the airflow control panel being movable between a first position wherein the opening is obstructed by the airflow control panel and a second position wherein the opening is unobstructed by the airflow control panel;

wherein airflow through the opening is substantially prevented when the airflow control panel is in the first position; and wherein the airflow control panel has guide means for guiding the removable component through the opening and into the chassis when the airflow control panel is in the second position.

18. The system as defined in claim 17, further comprising:

biasing means associated with the airflow control panel for biasing the airflow control panel toward the first position.

* * * * *